(12) United States Patent
Shigemasu et al.

(10) Patent No.: US 11,456,193 B2
(45) Date of Patent: Sep. 27, 2022

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Shogo Shigemasu, Kyoto (JP); Takahiro Yamada, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 67 days.

(21) Appl. No.: 16/843,948

(22) Filed: Apr. 9, 2020

(65) Prior Publication Data

US 2020/0381273 A1 Dec. 3, 2020

(30) Foreign Application Priority Data

May 30, 2019 (JP) .............................. JP2019-101369

(51) Int. Cl.
*H01L 21/67* (2006.01)

(52) U.S. Cl.
CPC .. *H01L 21/67115* (2013.01); *H01L 21/67248* (2013.01)

(58) Field of Classification Search
CPC ......... H01L 21/67115; H01L 21/67248; H01L 21/68707; H01L 21/6875; H01L 21/67288; G01J 5/0007
See application file for complete search history.

(56) References Cited

U.S. PATENT DOCUMENTS

| 5,305,417 A | 4/1994 | Najm |
| 2007/0291818 A1 | 12/2007 | Yasuda et al. |

(Continued)

FOREIGN PATENT DOCUMENTS

| JP | H11-329941 A | 11/1999 |
| JP | H11-329993 A | 11/1999 |

(Continued)

OTHER PUBLICATIONS

Notification of Reason for Refusal dated Nov. 4, 2021 in counterpart Korean Patent Application No. 10-2020-0064268 with English translation obtained from Global Dossier.

(Continued)

*Primary Examiner* — Mamadou L Diallo
(74) *Attorney, Agent, or Firm* — Ostrolenk Faber LLP

(57) ABSTRACT

After a semiconductor wafer held by a susceptor in a chamber is preheated by irradiating the semiconductor wafer with light from halogen lamps, the semiconductor wafer is irradiated with a flash of light from flash lamps. A temperature of the semiconductor wafer is measured with an end edge part radiation thermometer and a temperature of the susceptor is measured with a central part radiation thermometer. It is determined that the semiconductor wafer bows when a specific singular point appears in a temporal differentiation in the temperature measured with the end edge part radiation thermometer or a temporal differentiation in the temperature measured with the central part radiation thermometer. A flash light irradiation of the semiconductor wafer which is determined to be in the bowing state is omitted and the semiconductor wafer is transported out of the chamber, and the subsequent semiconductor wafer is transported into the chamber.

8 Claims, 10 Drawing Sheets

(56) References Cited

U.S. PATENT DOCUMENTS

| | | | |
|---|---|---|---|
| 2009/0175605 A1 | 7/2009 | Kobayashi | 392/416 |
| 2013/0052756 A1 | 2/2013 | Okujo et al. | |
| 2013/0084390 A1* | 4/2013 | Suzuki | G02B 21/365 |
| | | | 427/248.1 |
| 2015/0181649 A1 | 6/2015 | Ji | |
| 2017/0194177 A1 | 7/2017 | Cibere | |
| 2018/0240689 A1* | 8/2018 | Kitazawa | H01L 21/67115 |
| 2019/0141790 A1 | 5/2019 | Ito | |
| 2019/0153602 A1 | 5/2019 | Misaka | |
| 2019/0157168 A1* | 5/2019 | Kawarazaki | H01L 21/324 |
| 2019/0177219 A1* | 6/2019 | Karam | C03C 27/08 |
| 2019/0182915 A1 | 6/2019 | Hirochi et al. | |

FOREIGN PATENT DOCUMENTS

| | | |
|---|---|---|
| JP | 2000-173946 A | 6/2000 |
| JP | 2005-340591 A | 12/2005 |
| JP | 2006-054214 A | 2/2006 |
| JP | 2009-164451 | 7/2009 |
| JP | 2009-231694 A | 10/2009 |
| JP | 2013-046047 A | 3/2013 |
| JP | 2016-081971 A | 5/2016 |
| KR | 10-2013-0132263 A | 12/2013 |
| KR | 10-2018-0045048 A | 5/2018 |
| KR | 10-2018-0096501 A | 8/2018 |
| KR | 10-2019-0021267 A | 3/2019 |
| KR | 10-2019-0028538 A | 3/2019 |
| KR | 10-2019-0051859 A | 5/2019 |
| KR | 10-2019-0058326 A | 5/2019 |

OTHER PUBLICATIONS

Notice of Final Rejection dated Apr. 15, 2022 in counterpart Korean Patent Application No. 10-2020-0064268 with English translation obtained from One Portal Dossier.

Decision of Grant dated Jun. 2, 2022 in counterpart Korean Patent Application No. 10-2020-0064268.

* cited by examiner

F I G . 3
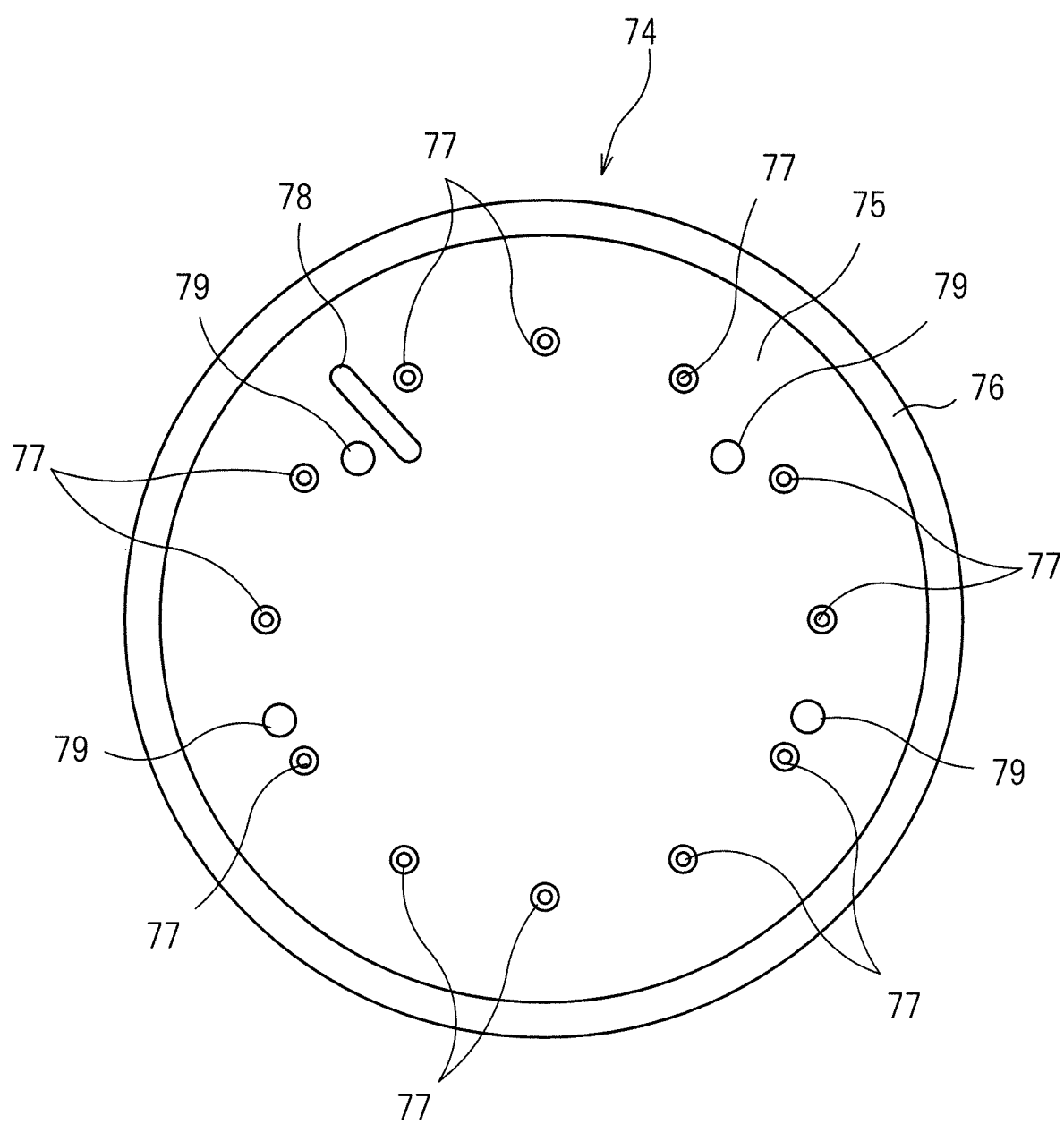

F I G 7
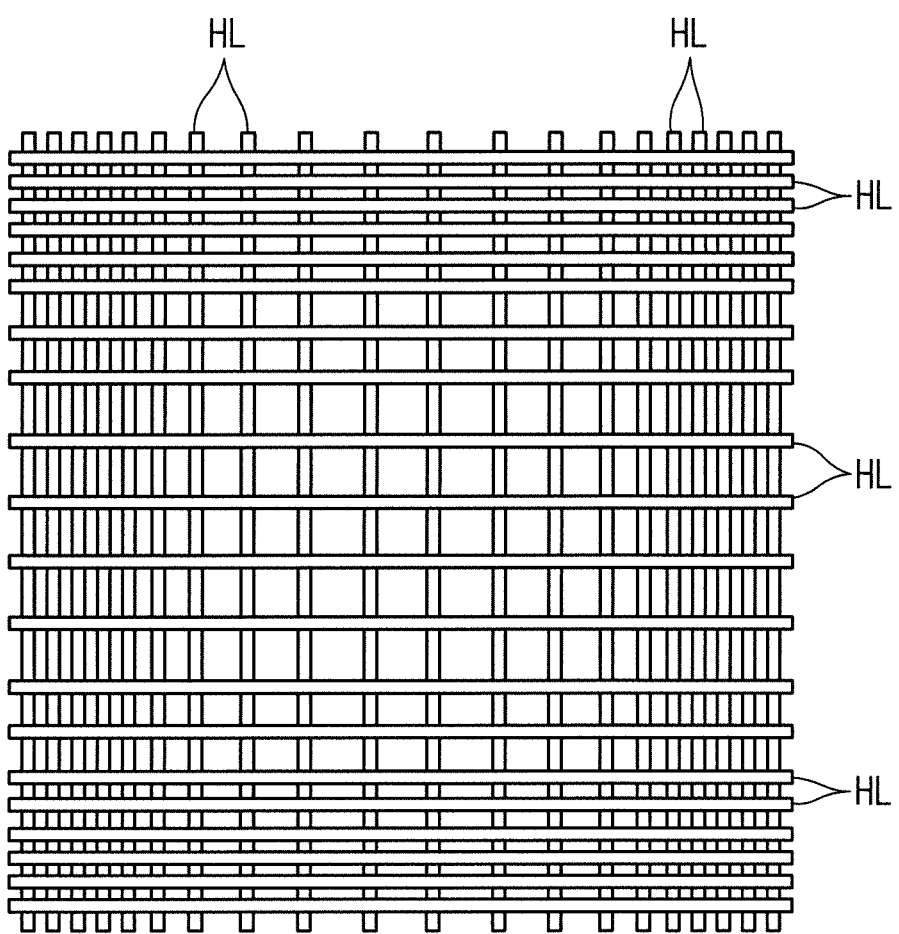

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and heat treatment apparatus which irradiates a thin plate-like precision electronic substrate (hereinafter referred to simply as a "substrate") such as a semiconductor wafer with light to heat the substrate.

Description of the Background Art

A flash lamp anneal (FLA) which heats a semiconductor wafer for an extremely short time in a process of manufacturing a semiconductor device attracts attention. The flash lamp anneal is a heat treatment technique of irradiating a surface of a semiconductor wafer with a flash of light using a xenon flash lamp (a simple term of "a flash lamp" means a xenon flash lamp hereinafter), thereby increasing a temperature of only the surface of the semiconductor wafer in an extremely short time (several milliseconds or less).

A radiation spectral distribution of the xenon flash lamp ranges from an ultraviolet region to a near-infrared region, thus a wavelength of the xenon flash lamp is shorter than that of a conventional halogen lamp, and almost coincides with a basic absorption band of a silicon semiconductor wafer. Thus, when the semiconductor wafer is irradiated with a flash of light emitted from the xenon flash lamp, the temperature of the semiconductor wafer can be rapidly increased with less transmitted light. It is also known that a flash light emission for the extremely short time of several milliseconds or less can selectively increase a temperature of only a region near the surface of the semiconductor wafer.

Such a flash lamp anneal is used for processing requiring a heating for an extremely short time, for example, conventionally an activation of impurity implanted into the semiconductor wafer. When the surface of the semiconductor wafer into which the impurity is implanted by an ion implantation method is irradiated with a flash of light from the flash lamp, the surface of the semiconductor wafer can be increased to an activation temperature only for the extremely short time, thus only an impurity activation can be executed without deeply diffusing the impurity.

US2009/0175605 discloses, as a heat treatment apparatus using such a xenon flash lamp, an apparatus in which a flash lamp is disposed on a surface side of a semiconductor wafer and a halogen lamp is disposed on a rear surface side thereof, and a desired heat treatment is performed by a combination of those lamps. In the heat treatment apparatus disclosed in US2009/0175605, the semiconductor wafer held by a susceptor is preheated to some degree of temperature by the halogen lamp, and subsequently the temperature of the semiconductor wafer is increased to a desired treatment temperature by a flash light irradiation from the flash lamp.

A thin plate-like semiconductor wafer may bow in some cases when the semiconductor wafer is preheated by the halogen lamp in the heat treatment disclosed in US2009/0175605. The bowing of the semiconductor wafer is caused by a heat treatment pattern of the halogen lamp or a problem that the semiconductor wafer itself has. In either case, when the semiconductor wafer in the bowing state is irradiated with a flash of intense light for an extremely short time from the flash lamp, the semiconductor wafer may get broken. When the wafer breakage occurs, the semiconductor wafer is wastefully consumed, and moreover, an inner portion of a chamber is contaminated by a large amount of particles, so that it takes a lot of time to perform a recovery work.

SUMMARY OF THE INVENTION

The present invention is intended for a heat treatment method of heating a substrate by irradiating the substrate with light.

According to one aspect of the present invention, a heat treatment method includes steps of: (a) transporting a substrate into a chamber to make a susceptor hold the substrate; (b) irradiating the substrate held by the susceptor with light from continuous lighting lamps; (c) measuring a temperature of the substrate with a first radiation thermometer; (d) measuring a temperature of the susceptor with a second radiation thermometer; and (e) determining that the substrate bows when a specific singular point appears in a temporal differentiation in a temperature measured with the first radiation thermometer or a temporal differentiation in a temperature measured with the second radiation thermometer.

The bowing of the substrate in a heat treatment can be detected without a visual confirmation, for example.

Preferably, the heat treatment method further includes a step of (f) irradiating the substrate with a flash of light from flash lamps after the step of (b), wherein when it is determined that the substrate bows in the step of (e), the irradiation of the substrate with the flash of light is omitted, and the substrate is transported out of the chamber, and a substrate subsequent to the substrate is transported into the chamber.

A breakage of the substrate is prevented before happens, thus a reduction in treatment efficiency can be prevented.

According to another aspect of the present invention, a heat treatment method includes steps of: (a) transporting a substrate into a chamber to make a susceptor hold the substrate; (b) irradiating the substrate held by the susceptor with light from continuous lighting lamps; (c) measuring a temperature of the substrate with a radiation thermometer; and (d) determining that the substrate bows when a specific singular point appears in a temporal differentiation in a temperature measured with the radiation thermometer.

According to another aspect of the present invention, a heat treatment method includes steps of: (a) transporting a substrate into a chamber to make a susceptor hold the substrate; (b) irradiating the substrate held by the susceptor with light from continuous lighting lamps; (c) measuring a temperature of the substrate with a radiation thermometer; and (d) determining that the substrate bows when a specific singular point appears in a temporal differentiation in a temperature measured with the radiation thermometer.

The bowing of the substrate in a heat treatment can be detected without a visual confirmation, for example.

The present invention is also intended for a heat treatment apparatus heating a substrate by irradiating the substrate with light.

According to another aspect of the present invention, a heat treatment apparatus includes: a chamber housing a substrate; a susceptor holding the substrate in the chamber; continuous lighting lamps irradiating the substrate held by the susceptor with light; a first radiation thermometer measuring a temperature of the substrate; a second radiation thermometer measuring a temperature of the susceptor; and a determination part determining that the substrate bows when a specific singular point appears in a temporal differentiation in a temperature measured with the first radiation thermometer or a temporal differentiation in a temperature measured with the second radiation thermometer.

The bowing of the substrate in a heat treatment can be detected without a visual confirmation, for example.

Preferably, the heat treatment apparatus further includes flash lamps irradiating the substrate with a flash of light after the continuous lighting lamps irradiate the substrate with the light, wherein when the determination part determines that the substrate bows, the irradiation of the substrate with the flash of light is omitted, and the substrate is transported out of the chamber, and a substrate subsequent to the substrate is transported into the chamber.

A breakage of the substrate is prevented before happens, thus a reduction in treatment efficiency can be prevented.

According to another aspect of the present invention, a heat treatment apparatus includes: a chamber housing a substrate; a susceptor holding the substrate in the chamber; continuous lighting lamps irradiating the substrate held by the susceptor with light; a radiation thermometer measuring a temperature of the substrate; and a determination part determining that the substrate bows when a specific singular point appears in a temporal differentiation in a temperature measured with the radiation thermometer.

According to another aspect of the present invention, a heat treatment apparatus includes: a chamber housing a substrate; a susceptor holding the substrate in the chamber; continuous lighting lamps irradiating the substrate held by the susceptor with light; a radiation thermometer measuring a temperature of the susceptor; and a determination part determining that the substrate bows when a specific singular point appears in a temporal differentiation in a temperature measured with the radiation thermometer.

The bowing of the substrate in a heat treatment can be detected without a visual confirmation, for example.

Therefore, the object of the present invention is to detect the bowing of the substrate in the heat treatment.

These and other objects, features, aspects and advantages of the present invention will become more apparent from the following detailed description of the present invention when taken in conjunction with the accompanying drawings.

BRIEF DESCRIPTION OF THE DRAWING

FIG. 3 is a plan view of a susceptor.

FIG. 7 is a plan view showing an arrangement of a plurality of halogen lamps.

DESCRIPTION OF THE PREFERRED EMBODIMENTS

A preferred embodiment according to the present invention will now be described in detail with reference to the drawings.

Figure 1:
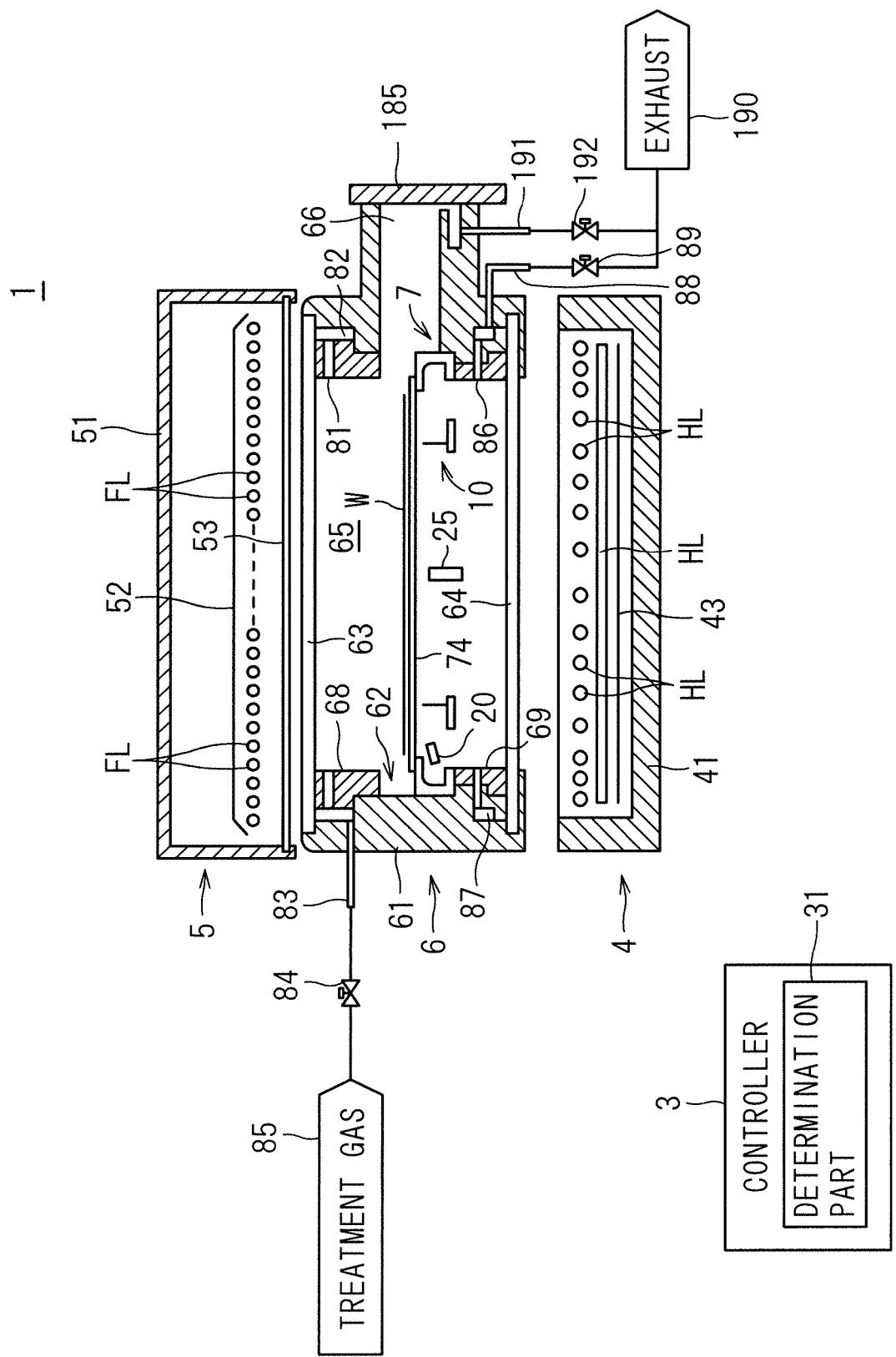
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 in FIG. 1 is a flash lamp annealer for heating a disk-shaped semiconductor wafer W serving as a substrate by irradiating the semiconductor wafer W with a flash of light. A size of the semiconductor wafer W to be treated is not particularly limited. For example, the semiconductor wafer W to be treated has a diameter of 300 mm or 450 mm (300 mm in the present preferred embodiment). An impurity is implanted into the semiconductor wafer W before being transported into the heat treatment apparatus 1, and a process of activating the implanted impurity is executed by a heat treatment in the heat treatment apparatus 1. It should be noted that dimensions of components and the number of components are shown in exaggeration or in simplified form, as appropriate, in FIG. 1 and the subsequent drawings for the sake of easier understanding.

The heat treatment apparatus 1 includes a chamber 6 for housing the semiconductor wafer W, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding the semiconductor wafer W in a horizontal attitude, and a transfer mechanism 10 provided inside the chamber 6 and for transferring the semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to perform a heat treatment on the semiconductor wafer W.

The chamber 6 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds the semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of the semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, the semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is supplied from the treatment gas supply source 85 to the buffer space 82. The treatment gas which has flowed into the buffer space 82 flows in a spreading manner within the buffer space 82 which is lower in fluid resistance than the gas supply opening 81, and is supplied through the gas supply opening 81 into the heat treatment space 65. An inert gas such as nitrogen ($N_2$), a reactive gas such as hydrogen ($H_2$) and ammonia ($NH_3$), or a gas mixture thereof, for example, can be used as the treatment gas (nitrogen gas in the present embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

A vacuum pump or an exhaust utility of a plant where the heat treatment apparatus 1 is placed can be used as the exhaust part 190. When the vacuum pump is adopted as the exhaust part 190 and an atmosphere within the heat treatment space 65 which is an enclosed space is exhausted while the valve 84 is closed and no gas is supplied through the gas supply opening 81 into the heat treatment space 65, pressure within the chamber 6 is reduced to a vacuum atmosphere. Even in a case where the vacuum pump is not used as the exhaust part 190, the pressure within the chamber 6 can be reduced to a pressure lower than atmospheric pressure by performing the exhaust process while no gas is supplied through the gas supply opening 81.

Figure 2:
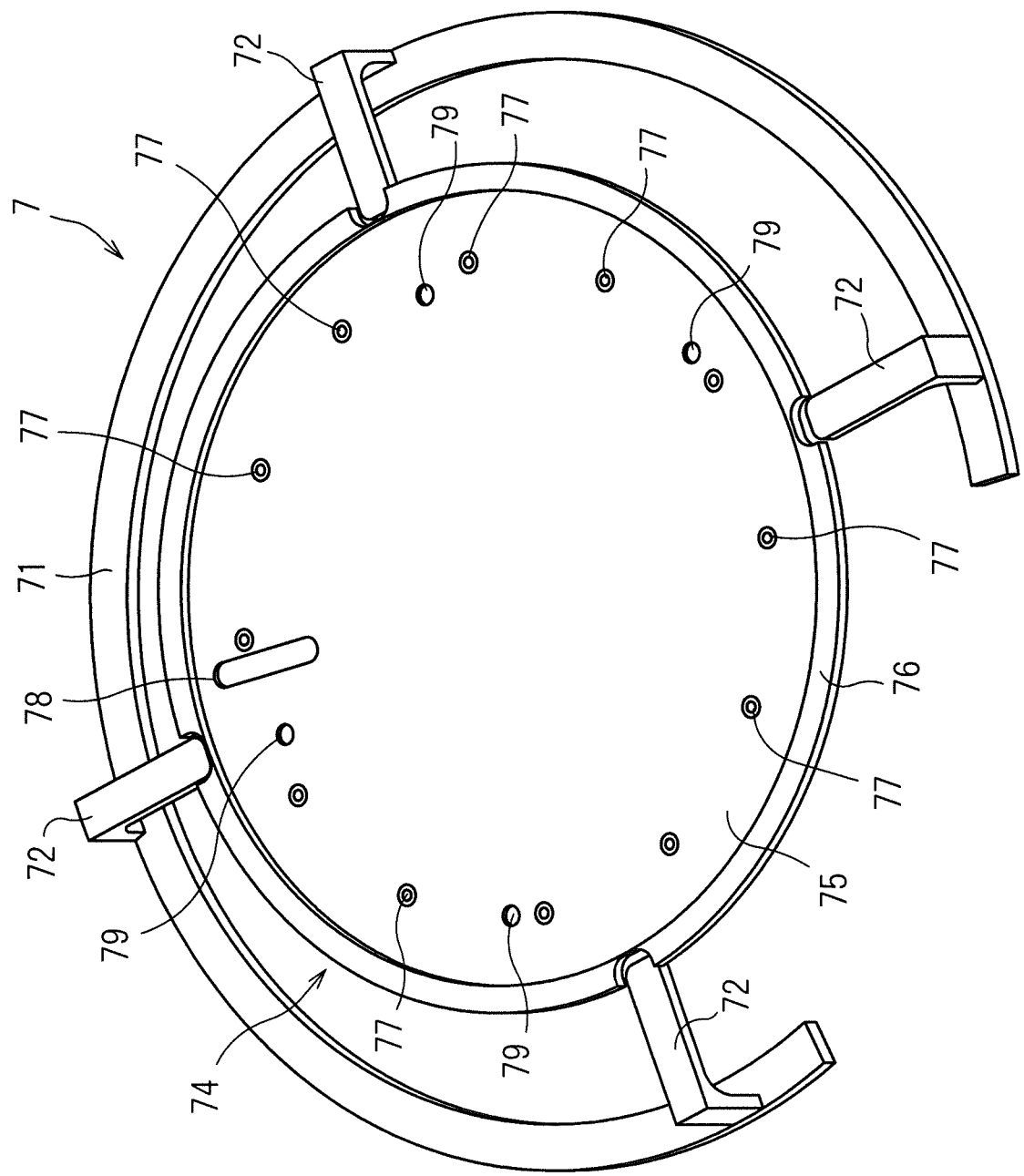
FIG. 2 is a perspective view showing an entire external appearance of a holder.

FIG. 2 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 4:
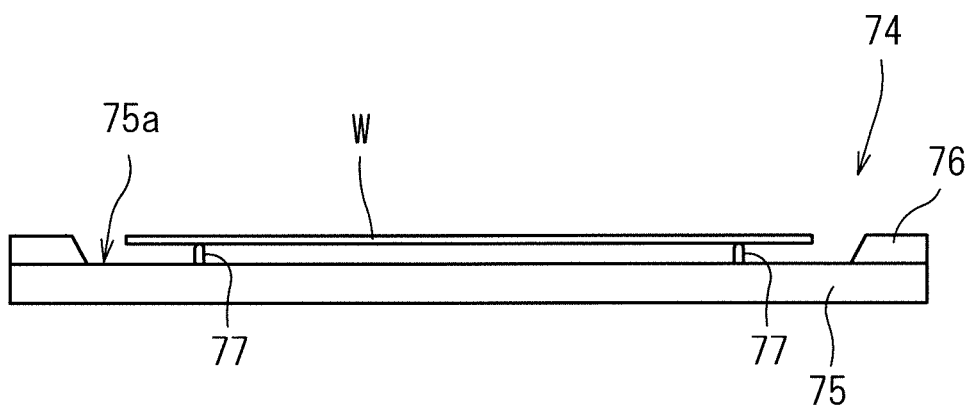
FIG. 4 is a sectional view of the susceptor.

The susceptor 74 is supported by the four coupling portions 72 provided on the base ring 71. FIG. 3 is a plan view of the susceptor 74. FIG. 4 is a cross-sectional view of the susceptor 74. The susceptor 74 includes a holding plate 75, a guide ring 76, and a plurality of substrate support pins 77. The holding plate 75 is a generally circular planar member made of quartz. A diameter of the holding plate 75 is greater than that of the semiconductor wafer W. In other words, the holding plate 75 has a size, as seen in plan view, greater than that of the semiconductor wafer W.

The guide ring 76 is provided on a peripheral part of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral part of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

The semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. A thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the end edge part radiation thermometer 20 (refer to FIG. 1) to receive radiation (infrared radiation) emitted from the lower surface of the semiconductor wafer W held by the susceptor 74. Specifically, the end edge part radiation thermometer 20 receives the radiation emitted from the lower surface of the semiconductor wafer W held by the susceptor 74 through the opening 78 to measure the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer the semiconductor wafer W.

Figure 5:
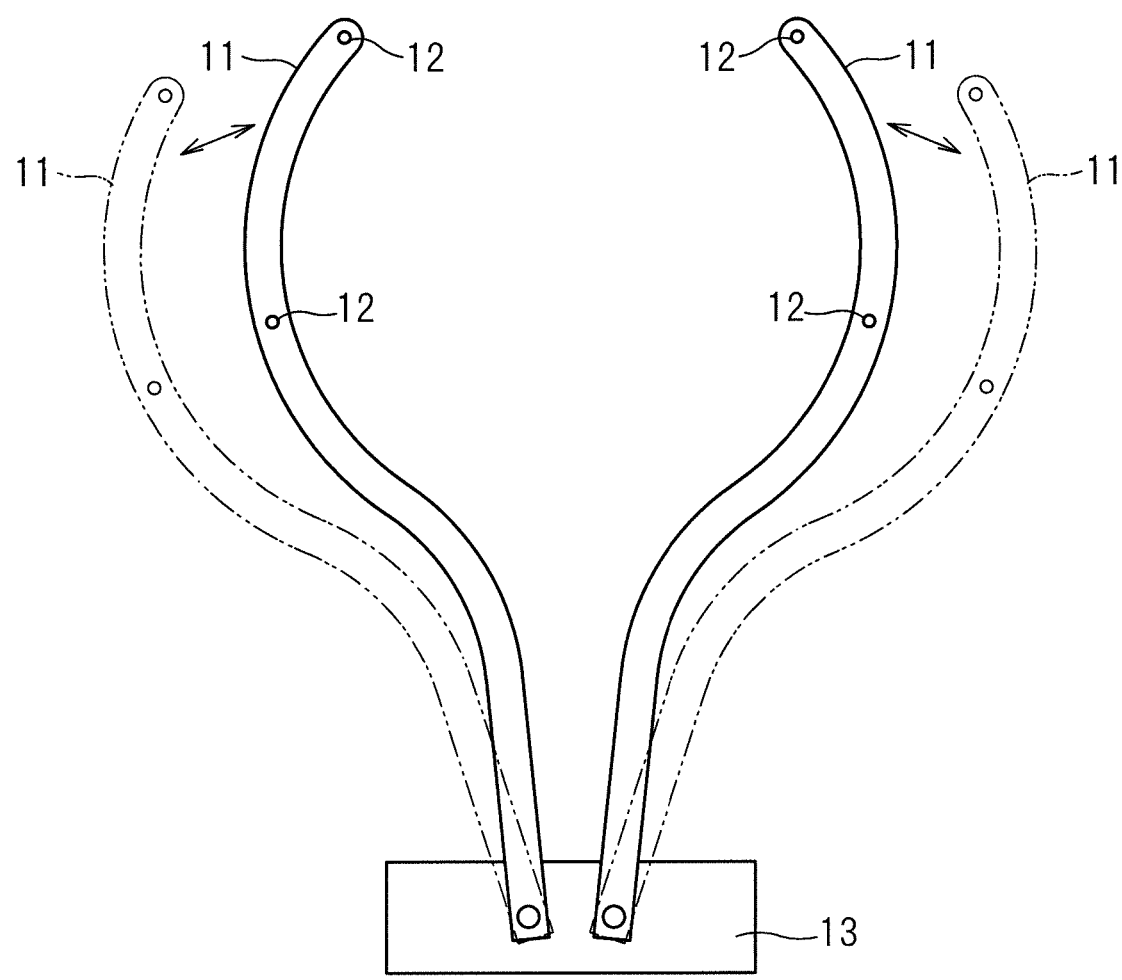
FIG. 5 is a plan view of a transfer mechanism.
Figure 6:
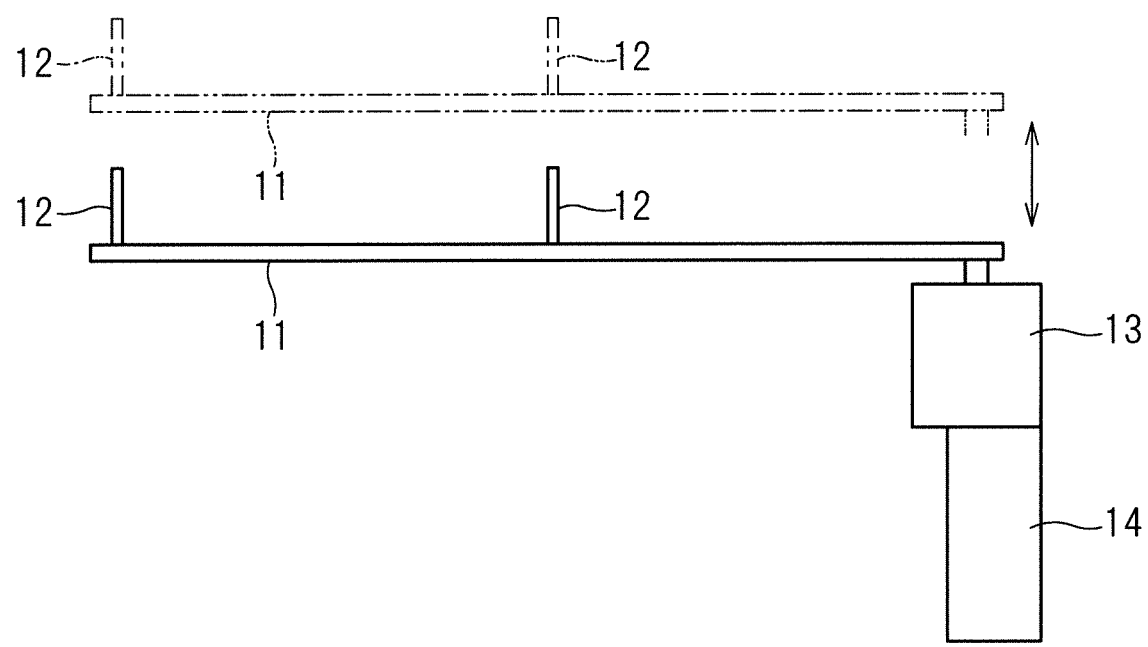
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses the linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the heat treatment apparatus 1 includes two radiation thermometers of the end edge part radiation thermometer (edge pyrometer) 20 and a central part radiation thermometer (center pyrometer) 25. As described above, the end edge part radiation thermometer 20 is a wafer thermometer receiving infrared radiation emitted from the end edge part of the lower surface of the semiconductor wafer W through the opening 78 of the susceptor 74 to measure the temperature of the semiconductor wafer W in accordance with the intensity of the infrared radiation. In the meanwhile, the central part radiation thermometer 25 is a susceptor thermometer receiving infrared radiation emitted from the central part of the susceptor 74 to measure the temperature of the susceptor 74 in accordance with the intensity of the infrared radiation. The end edge part radiation thermometer 20 and the central part radiation thermometer 25 are illustrated in an inner portion of the chamber 6 in FIG. 1 for convenience of illustration, however, both of them are attached to an outer wall surface of the chamber 6, and receive the infrared radiation through a through hole provided on the outer wall surface.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holder 7 (that is, in the horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to an outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect the flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiation part which directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of the semiconductor wafer W held by the holder 7 (that is, in the horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral part of the semiconductor wafer W held by the holder 7 than in a region opposed to a central part thereof. In other words, the halogen lamps HL in each of the upper and lower tiers are arranged at shorter intervals in the peripheral part of the lamp arrangement than in the central part thereof. This allows a greater amount of light to impinge upon the peripheral part of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined treatment program, whereby the processes in the heat treatment apparatus 1 proceed. A determination part 31 is a function processing part achieved by a CPU in the controller 3 executing a predetermined treatment program. The determination part 31 determines a bowing of the semiconductor wafer W based on a temperature measurement result of the end edge part radiation thermometer 20 and/or the central part radiation thermometer 25, and a process thereof is further described in detail.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 8:
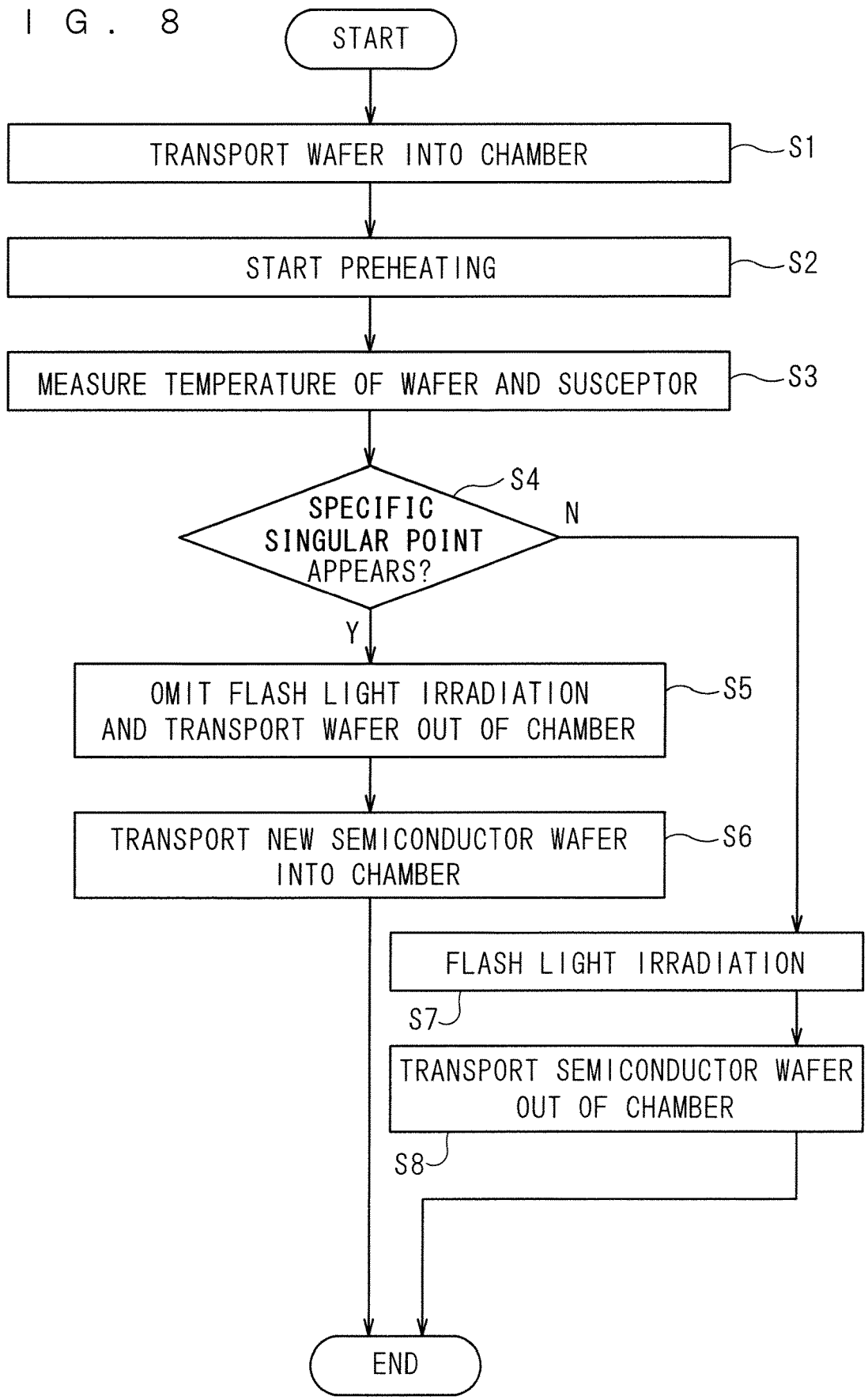
FIG. 8 is a flow chart showing a process procedure in the heat treatment apparatus.

A process operation in the heat treatment apparatus 1 is described next. FIG. 8 is a flow chart showing a process procedure in the heat treatment apparatus 1. The semiconductor wafer W to be treated herein is a semiconductor substrate to which an impurity (ion) is added by an ion implantation method. The impurity is activated by a flash irradiation heat treatment (anneal) performed by the heat treatment apparatus 1. The process procedure in the semiconductor wafer W described hereinafter proceeds when the controller 3 controls each operation mechanism of the heat treatment apparatus 1.

Firstly, the valve 84 for air supply is opened and the valves 89 and 192 for air exhaust are opened to start air supply and exhaust within the chamber 6 prior to the treatment of the semiconductor wafer W. When the valve 84 is opened, nitrogen gas is supplied from the gas supply opening 81 into the heat treatment space 65. Also, when the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. The nitrogen gas is continuously supplied into the heat treatment space 65 at the time of the heat treatment of the semiconductor wafer W in the heat treatment apparatus 1, and an amount of supply is appropriately changed in accordance with a treatment process.

Subsequently, the gate valve 185 is opened to open the transport opening 66. A transport robot outside the heat treatment apparatus 1 transports the semiconductor wafer W to be treated through the transport opening 66 into the heat treatment space 65 in the chamber 6 (Step S1). At this time, there is a possibility that the atmosphere outside the apparatus is carried into the heat treatment space 65 as the semiconductor wafer W is transported into the heat treatment space 65, however, the nitrogen gas is continuously supplied into chamber 6, thus the nitrogen gas flows through the transport opening 66 and it is possible to minimize an outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof where a pattern is formed and the impurity is implanted is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in the horizontal attitude from below by the susceptor 74 of the holder 7 formed of quartz, the 40 halogen lamps HL in the halogen heating part 4 are turned on at the same time and preheating (or assist-heating) is started (Step S2). Halogen light emitted from the halogen lamps HL is transmitted through the lower chamber window 64 and the susceptor 74 both made of quartz, and impinges on the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

When the preheating is performed by the halogen lamps HL, the temperature of the semiconductor wafer W is measured with the end edge part radiation thermometer 20, and the temperature of the susceptor 74 is measured with the central part radiation thermometer 25 (Step S3). Specifically, the radiation thermometer 20 receives infrared radiation emitted from the end edge part of the lower surface of the semiconductor wafer W held by the susceptor 74 through the opening 78 to measure the temperature of the semiconductor wafer W which is on the increase. The central part radiation thermometer 25 receives infrared radiation emitted from the susceptor 74 itself to measure the temperature of the susceptor 74 holding the semiconductor wafer W which is on the increase. The temperature of the semiconductor wafer W and susceptor 74 measured with the end edge part radiation thermometer 20 and the central part radiation thermometer 25 is transmitted to the controller 3. The temperature may be measured by the end edge part radiation thermometer 20 and the central part radiation thermometer 25 before the halogen lamps HL starts preheating.

Figure 9:
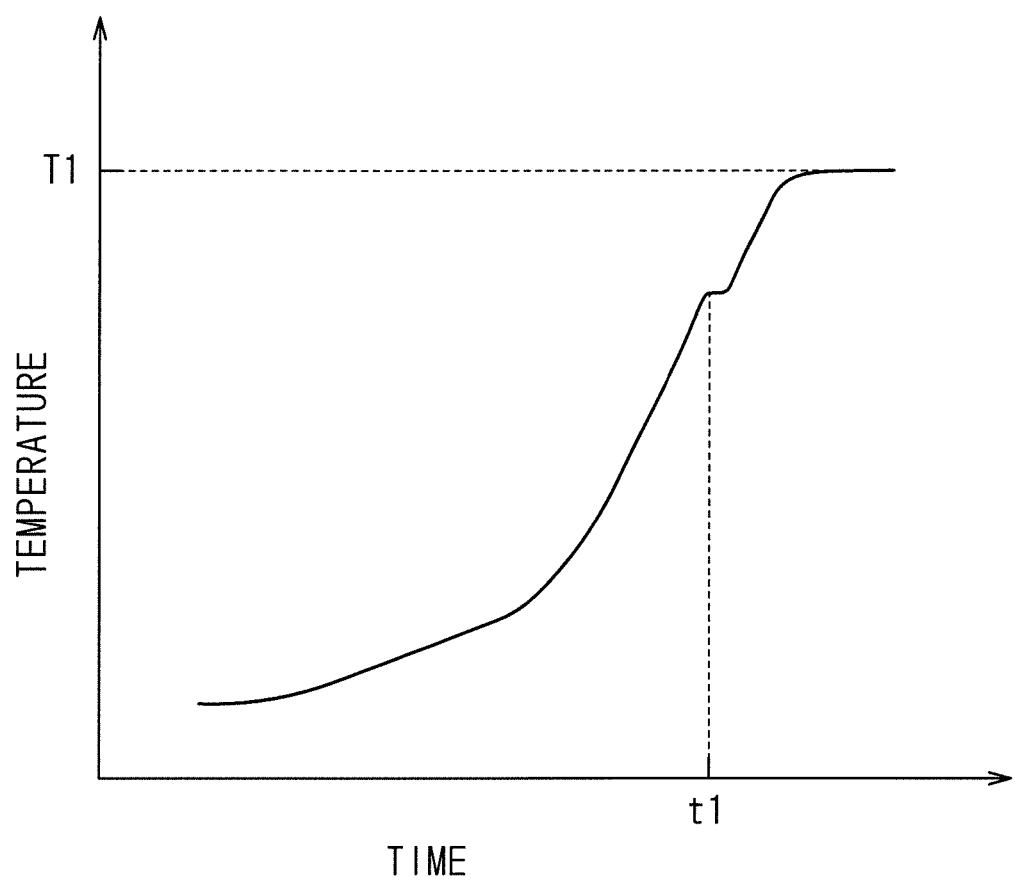
FIG. 9 is a drawing showing an example of a temperature profile of a semiconductor wafer measured with an end edge part radiation thermometer.
Figure 10:
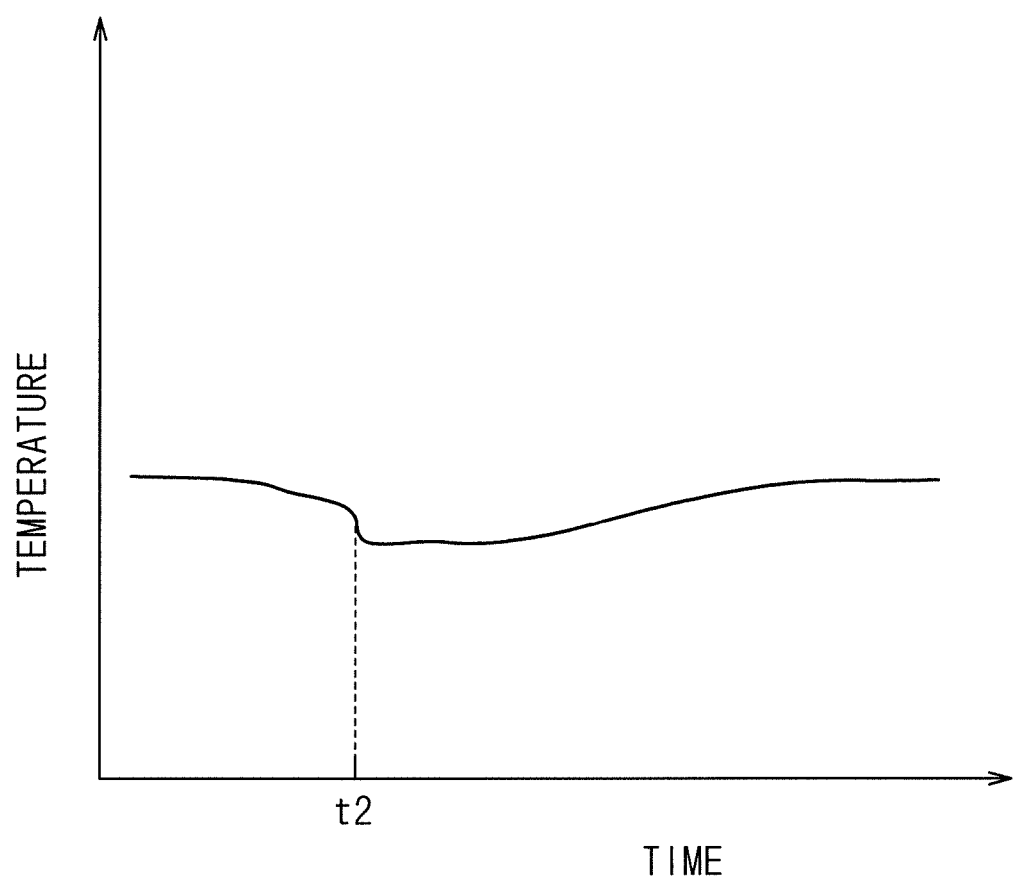
FIG. 10 is a drawing showing an example of a temperature profile of the susceptor measured with a central part radiation thermometer.

FIG. 9 is a drawing showing an example of a temperature profile of a semiconductor wafer W measured with the end edge part radiation thermometer 20. FIG. 10 is a drawing showing an example of a temperature profile of the susceptor 74 measured with the central part radiation thermometer 25. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on a value measured with the end edge part radiation thermometer 20. The preheating temperature T1 is set to be approximately 200° C. to 800° C. so that there is no possibility of diffusion of the impurity added to the semiconductor wafer W caused by the heat (750° C. in the present preferred embodiment)

The determination part 31 of the controller 3 monitors the bowing of the semiconductor wafer W based on the temperature measurement result of the end edge part radiation thermometer 20 and the central part radiation thermometer 25. Specifically, the determination part 31 monitors whether or not a specific singular point appears in a temporal differentiation in the temperature of the semiconductor wafer W measured with the end edge part radiation thermometer 20 or a temporal differentiation in the temperature of the susceptor 74 measured with the central part radiation thermometer 25 (Step S4). The temporal differentiation in the measured temperature is a temperature change rate (a temperature increase rate or a temperature decrease rate), and is also an inclination of the temperature profile illustrated in FIGS. 9 and 10. The specific singular point of the temporal differentiation in the measured temperature is a singular point at which the inclination of the temperature profile rapidly changes.

The thin plate-like semiconductor wafer W may bow in some cases when the temperature of the semiconductor wafer W is increased by the irradiation with light from the halogen lamps HL at the time of preheating. When the semiconductor wafer W bows, a measured distance from the end edge part radiation thermometer 20 to the semiconductor wafer W changes, and a measured angle between a light axis of the end edge part radiation thermometer 20 and the lower surface of the semiconductor wafer W also changes. As a result of the influence of the change in such a measured distance and measured angle on the measurement of the temperature of the end edge part radiation thermometer 20, the specific singular point appears in the temporal differentiation in the temperature of the semiconductor wafer W measured with the end edge part radiation thermometer 20. That is to say, the appearance of the specific singular point in the temporal differentiation in the temperature of the semiconductor wafer W measured with the end edge part radiation thermometer 20 indicates that the semiconductor wafer W bows. Thus, the determination part 31 determines that the semiconductor wafer W bows when the specific singular point appears in the temporal differentiation in the temperature of the semiconductor wafer W measured with the end edge part radiation thermometer 20.

More specifically, the determination part 31 determines that the semiconductor wafer W bows when the temporal differentiation in the temperature of the semiconductor wafer W measured with the end edge part radiation thermometer 20 changes to a value equal to or larger than a predetermined threshold value. For example, in the temperature profile illustrated in FIG. 9, in a case where the temperature increase rate of the semiconductor wafer W is 50° C. per second, when the temporal differentiation in the temperature measured with the end edge part radiation thermometer 20 changes by 20% or more, which is a threshold value, in other words, when the temporal differentiation changes to 40° C. per second or less or 60° C. per second or more, the determination part 31 determines that the specific singular point appears in the temporal differentiation in the measured temperature and determines that the semiconductor wafer W bows. In the example illustrated in FIG. 9, the specific singular point appears in the temporal differentiation in the temperature of the semiconductor wafer W measured with the end edge part radiation thermometer 20 at a time t1.

When the semiconductor wafer W bows, part of the semiconductor wafer W supported by the plurality of substrate support pins 77 and the holding plate 75 of the susceptor 74 have contact with each other. When the plurality of semiconductor wafers W are sequentially processed, the temperature of the susceptor 74 increases to a predetermined temperature. The preheating of the susceptor 74 to the predetermined temperature is also performed before the semiconductor wafer W which is a first wafer in a lot is processed. Thus, the temperature of the semiconductor wafer W is lower than that of the susceptor 74 at the time when the semiconductor wafer W having normal temperature is held by the susceptor 74. When the semiconductor wafer W having relatively low temperature bows and comes in contact with the susceptor 74, a thermal conduction from the susceptor 74 to the semiconductor wafer W occurs, and the temperature of the susceptor 74 near a portion having contact with the semiconductor wafer W rapidly decreases. As a result, the specific singular point appears in the temporal differentiation in the temperature of the susceptor 74 measured with the central part radiation thermometer 25. That is to say, the appearance of the specific singular point in the temporal differentiation in the temperature of the susceptor 74 measured with the central part radiation thermometer 25 also indicates that the semiconductor wafer W bows. Thus, the determination part 31 determines that the semiconductor wafer W bows also when the specific singular point appears in the temporal differentiation in the temperature of the susceptor 74 measured with the central part radiation thermometer 25.

More specifically, in the manner similar to the above description, the determination part 31 determines that the semiconductor wafer W bows when the temporal differentiation in the temperature of the susceptor 74 measured with the central part radiation thermometer 25 changes to a value equal to or larger than a predetermined threshold value. In the example illustrated in FIG. 10, the determination part 31 determines that the specific singular point appears in the temporal differentiation in the temperature measured with the central part radiation thermometer 25 at a time t2, and determines that the semiconductor wafer W bows.

In the present preferred embodiment, the determination part 31 determines that the semiconductor wafer W bows when the specific singular point appears in at least one of the temporal differentiation in the temperature of the semiconductor wafer W measured with the end edge part radiation thermometer 20 and the temporal differentiation in the temperature of the susceptor 74 measured with the central part radiation thermometer 25. That is to say, the determination part 31 determines that the semiconductor wafer W does not bow when the specific singular point does not appear in any of the temporal differentiation in the temperature of the semiconductor wafer W measured with the end edge part radiation thermometer 20 and the temporal differentiation in the temperature of the susceptor 74 measured with the central part radiation thermometer 25.

When the singular point does not appear and the determination part 31 determines that the semiconductor wafer W does not bow, the process proceeds from Step S4 to Step S7, and the semiconductor wafer W in a normal state is irradiated with a flash of light. Specifically, the flash lamps FL in the flash heating part 5 irradiate the front surface of the semiconductor wafer W held by the susceptor 74 with a flash of light at a time when a predetermined time period has elapsed since the temperature of the semiconductor wafer W reaches the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such a flash of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W is increased instantaneously to a treatment temperature T2 of 1000° C. or more by the flash irradiation from the flash lamps FL, and after the impurity implanted into the semiconductor wafer W is activated, the temperature of the front surface decreases rapidly. In this manner, the heat treatment apparatus 1 can increase and decrease the temperature of the front surface of the semiconductor wafer W in the extremely short time, thus the diffusion of the impurity implanted into the semiconductor wafer W caused by the heat can be suppressed and the impurity can be activated. The time required for the activation of the impurity is extremely shorter than the time required for a heat diffusion, thus the activation is completed in a short time of approximately 0.1 milliseconds to 100 milliseconds in which the diffusion does not occur.

When the flash heating treatment is finished, the halogen lamps HL are turned off after an elapse of a predetermined time. Accordingly, the temperature of the semiconductor wafer W decreases rapidly from the preheating temperature T1. The end edge part radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the end edge part radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 out of the chamber 6 (Step S8). Thus, the heating treatment of the semiconductor wafer W is completed.

In the meanwhile, when the specific singular point appears and the determination part 31 determines that the semiconductor wafer W bows, the process proceeds from Step S4 to Step S5, thus the subsequent flash light irradiation is omitted, and the semiconductor wafer W is transported out of the chamber 6. The flash of light emitted from the flash lamps FL is an intense light emitted for the extremely short period of time. The semiconductor wafer W which has bowed is instantaneously irradiated with such an intense light, the semiconductor wafer W may get broken. Thus, when it is determined that the semiconductor wafer W bows, the semiconductor wafer W is not irradiated with the flash of light, but is transported out of the chamber 6.

After the semiconductor wafer W which is determined to be in the bowing state is transported out of the chamber 6, the subsequent new semiconductor wafer W is transported into the chamber 6 (Step S6). Then, the process similar to that described above is performed on the subsequent semiconductor wafer W which has been newly transported into the chamber 6.

In the present preferred embodiment, it is determined that the semiconductor wafer W bows when the specific singular point appears in the temporal differentiation in the temperature of the semiconductor wafer W measured with the end edge part radiation thermometer 20 or the temporal differentiation in the temperature of the susceptor 74 measured with the central part radiation thermometer 25 at the time of preheating the semiconductor wafer W by the halogen lamps HL. Thus, the bowing of the semiconductor wafer W can be automatically detected during preheat treatment before the flash light irradiation without a visual confirmation, for example.

The bowing of the semiconductor wafer W is detected before the flash light irradiation, thus the bowing semiconductor wafer W can be prevented from being irradiated with the flash of light and getting broken before happens. Accordingly, a contamination in the chamber 6 caused by fragments of the broken semiconductor wafer W can be prevented.

The flash light irradiation of the semiconductor wafer W which is determined to be in the bowing state is omitted and the semiconductor wafer W is transported out of the chamber 6, and subsequently, the subsequent semiconductor wafer W is transported into the chamber 6 to perform the treatment. Accordingly, a downtime in the heat treatment apparatus 1 does not occur when the bowing occurs, and reduction in throughput can be prevented.

While the preferred embodiments according to the present invention have been described hereinabove, various modifications of the present invention are possible in addition to those described above without departing from the scope and spirit of the present invention. In the present preferred embodiment, it is determined that the semiconductor wafer W bows when the specific singular point appears in the temporal differentiation in the temperature of the semiconductor wafer W measured with the end edge part radiation thermometer 20 or the temporal differentiation in the temperature of the susceptor 74 measured with the central part radiation thermometer 25. Instead of this, also applicable is that it is determined that the semiconductor wafer W bows only when the specific singular point appears in both the temporal differentiation in the temperature of the semiconductor wafer W measured with the end edge part radiation thermometer 20 and the temporal differentiation in the temperature of the susceptor 74 measured with the central part radiation thermometer 25. According to such a configuration, an erroneous detection of determining that the bowing occurs even though the semiconductor wafer W does not bow can be reduced.

Also applicable is a configuration that it is determined that the semiconductor wafer W bows when the specific singular point appears in only one of the temporal differentiation in the temperature of the semiconductor wafer W measured with the end edge part radiation thermometer 20 and the temporal differentiation in the temperature of the susceptor 74 measured with the central part radiation thermometer 25. That is to say, it is determined that the semiconductor wafer W bows when the specific singular point appears in the temporal differentiation in the temperature measured with the end edge part radiation thermometer 20 regardless of the change in the temporal differentiation in the temperature measured with the central part radiation thermometer 25. Alternatively, it is determined that the semiconductor wafer W bows when the specific singular point appears in the temporal differentiation in the temperature measured with the central part radiation thermometer 25 regardless of the change in the temporal differentiation in the temperature measured with the end edge part radiation thermometer 20.

When the temperature of the semiconductor wafer W is relatively high, the specific singular point tends to appear in the temporal differentiation in the temperature measured with the end edge part radiation thermometer 20 at the time of the bowing of the wafer. In contrast, when the temperature of the semiconductor wafer W is relatively low, the specific singular point tends to appear in the temporal differentiation in the temperature measured with the central part radiation thermometer 25 at the time of the bowing of the wafer. Accordingly, when the temperature of the semiconductor wafer W increased by the light irradiation from the halogen lamps HL is smaller than a predetermined value (for example, 400° C.), it is preferable that the bowing of the semiconductor wafer W is determined by the temporal differentiation in the temperature of the susceptor 74 measured with the central part radiation thermometer 25. In the meanwhile, when the temperature of the semiconductor wafer W is equal to or larger than the predetermined value, it is preferable that the bowing of the semiconductor wafer W is determined by the temporal differentiation in the temperature of the semiconductor wafer W measured with the end edge part radiation thermometer 20.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as continuous lighting lamps to perform the preheating. In this case, the bowing of the semiconductor wafer W heated by the light irradiation from the arc lamps is detected.

The substrate to be treated by the heat treatment apparatus 1 is not limited to the semiconductor wafer, but a glass substrate used for a flat panel display in a liquid crystal display device, for example, or a substrate for a solar cell are also applicable. It is also applicable that the heat treatment apparatus 1 performs a heat treatment of a high dielectric gate insulating film (high-k film), a bonding of metal and silicon, or a crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method of heating a substrate by irradiating said substrate with light, comprising steps of:
   (a) transporting a substrate into a chamber to make a susceptor hold the substrate;
   (b) irradiating the substrate held by the susceptor with light from continuous lighting lamps;
   (c) measuring a temperature of the substrate with a first radiation thermometer;
   (d) measuring a temperature of the susceptor with a second radiation thermometer; and
   (e) determining that the substrate bows when a specific singular point appears in a temporal differentiation in a temperature measured with the first radiation thermometer or a temporal differentiation in a temperature measured with the second radiation thermometer, wherein
   in the step of (e), it is determined that the substrate bows when the temporal differentiation in the temperature measured with the first radiation thermometer changes to a value equal to or larger than a first threshold value or the temporal differentiation in the temperature measured with the second radiation thermometer changes to a value equal to or larger than a second threshold value.

2. A heat treatment method of heating a substrate by irradiating said substrate with light, comprising steps of:
   (a) transporting a substrate into a chamber to make a susceptor hold the substrate;
   (b) irradiating the substrate held by the susceptor with light from continuous lighting lamps;
   (c) measuring a temperature of the substrate with a first radiation thermometer;
   (d) measuring a temperature of the susceptor with a second radiation thermometer; and
   (e) determining that the substrate bows when a specific singular point appears in a temporal differentiation in a temperature measured with the first radiation thermometer or a temporal differentiation in a temperature measured with the second radiation thermometer, wherein
   in the step of (e), the determination is performed in accordance with the temporal differentiation in the temperature measured with the second radiation thermometer when the temperature of the substrate increased in accordance with a light irradiation is smaller than a predetermined value, and the determination is performed in accordance with the temporal differentiation in the temperature measured with the first radiation thermometer when the temperature of the substrate is equal to or larger than predetermined value.

3. A heat treatment method of heating a substrate by irradiating said substrate with light, comprising steps of:
   (a) transporting a substrate into a chamber to make a susceptor hold the substrate;

(b) irradiating the substrate held by the susceptor with light from continuous lighting lamps;
(c) measuring a temperature of the substrate with a first radiation thermometer;
(d) measuring a temperature of the susceptor with a second radiation thermometer; and
(e) determining that the substrate bows when a specific singular point appears in a temporal differentiation in a temperature measured with the first radiation thermometer or a temporal differentiation in a temperature measured with the second radiation thermometer, wherein
in the step of (e), it is determined that the substrate bows when a specific singular point appears in a temporal differentiation in a temperature measured with the first radiation thermometer and a temporal differentiation in a temperature measured with the second radiation thermometer.

4. A heat treatment method of heating a substrate by irradiating said substrate with light, comprising steps of:
(a) transporting a substrate into a chamber to make a susceptor hold the substrate;
(b) irradiating the substrate held by the susceptor with light from continuous lighting lamps;
(c) measuring a temperature of the substrate with a first radiation thermometer;
(d) measuring a temperature of the susceptor with a second radiation thermometer;
(e) determining that the substrate bows when a specific singular point appears in a temporal differentiation in a temperature measured with the first radiation thermometer or a temporal differentiation in a temperature measured with the second radiation thermometer, and
(f) irradiating the substrate with a flash of light from flash lamps after the step of (b), wherein
when it is determined that the substrate bows in the step of (e), the irradiation of the substrate with the flash of light is omitted, and the substrate is transported out of the chamber, and a substrate subsequent to the substrate is transported into the chamber.

5. A heat treatment method of heating a substrate by irradiating said substrate with light, comprising steps of:
(a) transporting a substrate into a chamber to make a susceptor hold the substrate;
(b) irradiating the substrate held by the susceptor with light from continuous lighting lamps;
(c) measuring a temperature of the substrate with a radiation thermometer; and
(d) determining that the substrate bows when a specific singular point appears in a temporal differentiation in a temperature measured with the radiation thermometer, wherein in the step of (d), it is determined that the substrate bows when the temporal differentiation in the temperature measured with the radiation thermometer changes to a value equal to or larger than a threshold value.

6. A heat treatment method of heating a substrate by irradiating said substrate with light, comprising steps of:
(a) transporting a substrate into a chamber to make a susceptor hold the substrate;
(b) irradiating the substrate held by the susceptor with light from continuous lighting lamps;
(c) measuring a temperature of the susceptor with a radiation thermometer; and
(d) determining that the substrate bows when a specific singular point appears in a temporal differentiation in a temperature measured with the radiation thermometer, wherein in the step of (d), it is determined that the substrate bows when the temporal differentiation in the temperature measured with the radiation thermometer changes to a value equal to or larger than a threshold value.

7. A heat treatment method of heating a substrate by irradiating said substrate with light, comprising steps of:
(a) transporting a substrate into a chamber to make a susceptor hold the substrate;
(b) irradiating the substrate held by the susceptor with light from continuous lighting lamps;
(c) measuring a temperature of the substrate with a radiation thermometer;
(d) determining that the substrate bows when a specific singular point appears in a temporal differentiation in a temperature measured with the radiation thermometer, and
(e) irradiating the substrate with a flash of light from flash lamps after the step of (b), wherein
when it is determined that the substrate bows in the step of (d), the irradiation of the substrate with the flash of light is omitted, and the substrate is transported out of the chamber, and a substrate subsequent to the substrate is transported into the chamber.

8. A heat treatment method of heating a substrate by irradiating said substrate with light, comprising steps of:
(a) transporting a substrate into a chamber to make a susceptor hold the substrate;
(b) irradiating the substrate held by the susceptor with light from continuous lighting lamps;
(c) measuring a temperature of the susceptor with a radiation thermometer; and
(d) determining that the substrate bows when a specific singular point appears in a temporal differentiation in a temperature measured with the radiation thermometer, and
(e) irradiating the substrate with a flash of light from flash lamps after the step of (b), wherein
when it is determined that the substrate bows in the step of (d), the irradiation of the substrate with the flash of light is omitted, and the substrate is transported out of the chamber, and a substrate subsequent to the substrate is transported into the chamber.

\* \* \* \* \*